United States Patent
Lee et al.

(10) Patent No.: US 8,330,278 B2
(45) Date of Patent: Dec. 11, 2012

(54) SEMICONDUCTOR PACKAGE INCLUDING A PLURALITY OF STACKED SEMICONDUCTOR DEVICES

(75) Inventors: Heeseok Lee, Yongin-si (KR); YunSeok Choi, Hwaseong-si (KR); Yonghoon Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 211 days.

(21) Appl. No.: 12/607,274

(22) Filed: Oct. 28, 2009

(65) Prior Publication Data

US 2010/0102428 A1    Apr. 29, 2010

(30) Foreign Application Priority Data

Oct. 28, 2008   (KR) .................. 10-2008-0105762

(51) Int. Cl.
- *H01L 23/48* (2006.01)
- *H01L 23/52* (2006.01)
- *H01L 29/40* (2006.01)

(52) U.S. Cl. ........ 257/777; 257/723; 257/686; 257/622; 438/109

(58) Field of Classification Search .................. 257/686, 257/777, 778, 723, 737, 738, 781, 782, 783, 257/786, 774, 775, 776, 734, 678, 622; 438/108, 438/109, 110, 106

See application file for complete search history.

(56) References Cited

U.S. PATENT DOCUMENTS

| | | | | |
|---|---|---|---|---|
| 6,906,415 | B2 * | 6/2005 | Jiang et al. | 257/723 |
| 7,327,020 | B2 | 2/2008 | Kwon et al. | |
| 7,531,905 | B2 * | 5/2009 | Ishino et al. | 257/777 |
| 7,829,998 | B2 * | 11/2010 | Do et al. | 257/698 |
| 2007/0273014 | A1 | 11/2007 | Lee et al. | |
| 2009/0032928 | A1 * | 2/2009 | Chiang et al. | 257/686 |
| 2009/0267207 | A1 * | 10/2009 | Koide et al. | 257/686 |
| 2010/0133704 | A1 * | 6/2010 | Marimuthu et al. | 257/778 |

FOREIGN PATENT DOCUMENTS

| | | |
|---|---|---|
| JP | 2005203776 | 7/2005 |
| JP | 2007150208 | 6/2007 |
| JP | 2007318076 | 12/2007 |
| KR | 20050074251 | 7/2005 |
| KR | 20070113590 | 11/2007 |
| KR | 20090019297 | 2/2009 |

* cited by examiner

*Primary Examiner* — Ha Tran T Nguyen
*Assistant Examiner* — Thanh Y Tran
(74) *Attorney, Agent, or Firm* — Stanzione & Kim, LLP

(57) ABSTRACT

A semiconductor package that includes a first semiconductor device mounted on a package substrate and includes an inactive surface having a cavity and an active surface opposite to the inactive surface, a second semiconductor device that is disposed on the active surface and electrically connected to the first semiconductor device, and a third semiconductor device that is disposed on the inactive surface in the cavity and electrically connected to the first semiconductor device. The first semiconductor device includes at least one first through electrode electrically connecting the first semiconductor device to the third semiconductor device through the first semiconductor device.

13 Claims, 18 Drawing Sheets

SEMICONDUCTOR PACKAGE INCLUDING A PLURALITY OF STACKED SEMICONDUCTOR DEVICES

CROSS-REFERENCE TO RELATED APPLICATIONS

This application claims priority from Korean Patent Application No. 10-2008-0105762 filed on Oct. 28, 2008 in the Korean Intellectual Property Office, the disclosure of which is incorporated herein by reference in its entirety.

BACKGROUND

1. Field of the Invention

The present invention relates to a semiconductor, and more particularly, to a semiconductor package in which a plurality of semiconductor devices are stacked.

2. Description of the Related Art

With the remarkable recent advance in electronic industries, there is a user's requirement for smaller, lighter, and multifunctional electronic products. In order to meet the requirement, various techniques for constructing the same kind or different kinds of integrated circuit chips in a single module have been developed. A System-In-Package (SIP) is one of novel packaging techniques based on such a trend.

The System-In-Package (SIP) has different kinds of semiconductor chips that are arranged or stacked in a single package to serve as a completive system itself. In an SIP, individual devices having various functions are built in a single package to make electronic products compact.

SUMMARY

There is a need for a semiconductor package to have a System-In-Package (SIP) and to improve structural and/or electrical characteristics. Exemplary embodiments of the present general inventive concept provide a semiconductor package.

Additional features and utilities of the present general inventive concept will be set forth in part in the description which follows and, in part, will be obvious from the description, or may be learned by practice of the general inventive concept.

Exemplary embodiments of the present general inventive concept may provide a semiconductor package having a first semiconductor device that is mounted on a package substrate and includes an inactive surface having a cavity and an active surface opposite to the inactive surface, a second semiconductor device that is disposed on the active surface and electrically connected to the first semiconductor device, and a third semiconductor device which is disposed on the inactive surface in the cavity and electrically connected to the first semiconductor device. The first semiconductor device includes at least one first through electrode electrically connecting the first semiconductor device to the third semiconductor device through the first semiconductor device.

Exemplary embodiments of the present general inventive concept also provide a semiconductor package, including a first semiconductor device having a first surface and a second surface, the second surface including a cavity having a first plurality of electrodes disposed on at least one surface of the cavity that electrically connect to the first surface, a second semiconductor device disposed on the first surface, with a second plurality of electrical connections disposed between the second semiconductor device and the first semiconductor device to electrically connect the first and second semiconductor devices, and a third semiconductor device disposed in the cavity, with a third plurality of electrical contacts disposed between the third semiconductor device and the electrodes to electrically connect the third semiconductor device with the electrodes.

The semiconductor package may also include where the first semiconductor device is disposed on a first side of a substrate and is electrically connected to the substrate.

The semiconductor package may also include a fourth semiconductor device having a first surface and a second surface, the second surface including a cavity having a first plurality of electrodes disposed on at least one surface of the cavity that electrically connect to the first surface, a fifth semiconductor device disposed on the first surface, with a second plurality of electrical connections disposed between the fifth semiconductor device and the fourth semiconductor device to electrically connect the fourth and fifth semiconductor devices, and a sixth semiconductor device disposed in the cavity, with a third plurality of electrical contacts disposed between the sixth semiconductor device and the electrodes to electrically connect the sixth semiconductor device with the electrodes, where the fourth semiconductor device is disposed on a second side of the substrate and is electrically connected to the substrate.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE EMBODIMENTS

Figure 1:
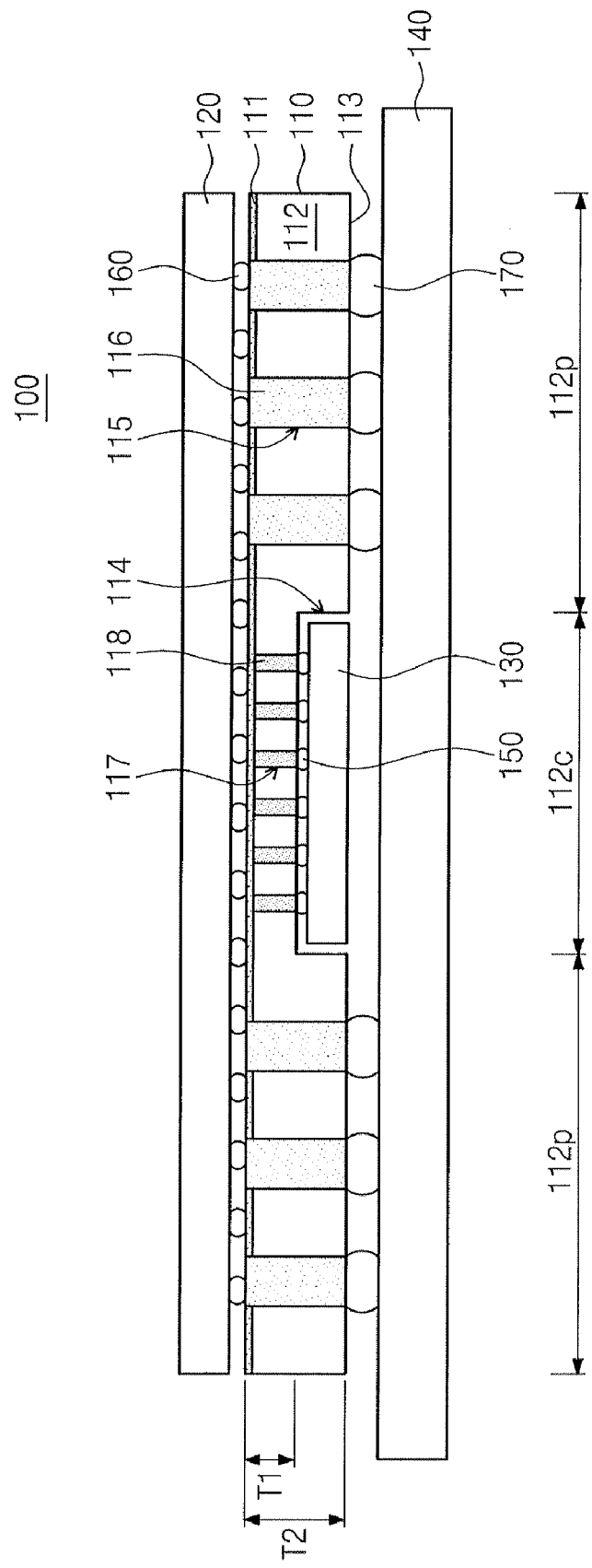
FIG. 1 is a cross-sectional view illustrating a semiconductor package according to exemplary embodiments of present general inventive concept.

Advantages and features of the present invention and methods of accomplishing the same may be understood more readily by reference to the following detailed description of preferred embodiments and the accompanying drawings. The present invention may, however, be implemented in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Like reference numerals refer to like elements throughout the specification.

FIGS. 1 to 4 are cross-sectional views illustrating semiconductor packages according to various exemplary embodiments of the present general inventive concept.

Referring to FIG. 1, a semiconductor package 100 according to exemplary embodiments of the present general inventive concept may include the same or different kinds of chips stacked in a first direction. In the semiconductor package 100, memory chips may be mounted on a plurality of surfaces of a logic chip interposed therebetween. Therefore, the semiconductor package 100 may be a System-In-Package (SIP).

The semiconductor package 100 may have, for example, a chip-on-chip (COC) structure including a first semiconductor integrated circuit chip 110, a second semiconductor integrated circuit chip 120, and a third semiconductor integrated circuit chip 130 which are stacked in the order named, or in any other suitable order. These chips 110, 120, and 130 may electrically be connected to one another by bumps 150 and 160 and/or through electrodes 116 and 118. The through electrodes 116 and 118 may have different configurations depending on, for example, the number of chips stacked, the arrangement of the chips, the arrangement of other electrical components in the semiconductor package 100, or any other suitable factor.

Figure 15:
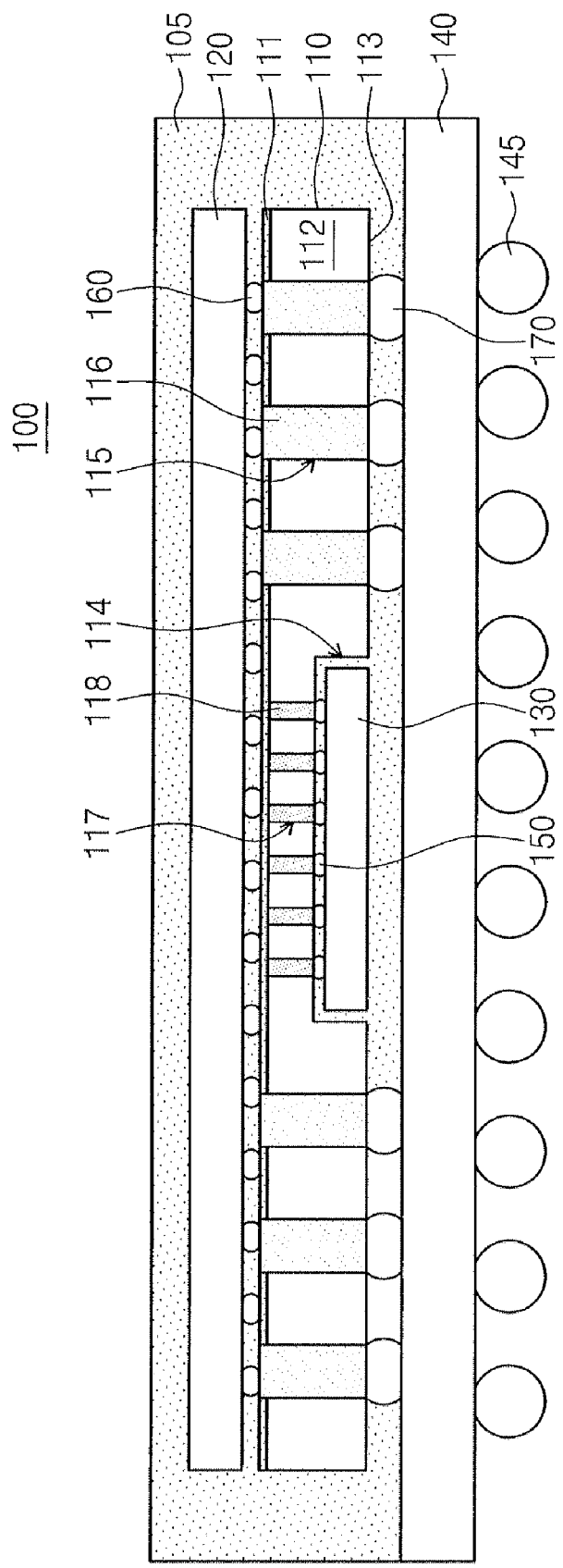
FIG. 15 is a cross-sectional view illustrating a modified version of the exemplary embodiments illustrated in FIG. 1.

Alternatively, as illustrated in FIG. 15, the semiconductor package 100 may further include a molding layer 105 to mold the semiconductor package 100 and/or an external connection terminal 145 such as a solder ball. The above descriptions may be commonly applied alone, in combination, or in part to various exemplary embodiments described herein.

At least one of the semiconductor integrated circuit chips 110, 120, and 130 may be a logic chip or a memory chip. As will be described below, the first semiconductor integrated circuit chip 110 may be a logic chip and the second and the third semiconductor integrated circuit chips 120 and 130 may be memory chips. However, the exemplary embodiments of the present general inventive concept are not limited thereto. Reference numerals 110 to 130 may represent chip-unit, wafer-unit, or package-unit semiconductor devices, respectively.

The first semiconductor integrated circuit chip 110 may be a logic chip having an inactive surface 113 facing toward a package substrate 140, and an active surface 111 facing in a first direction (e.g., facing up, and may be referred to as being in a "face-up" state).

The first semiconductor integrated circuit chip 110 may have a cavity 114 formed on the inactive surface 113 of the substrate 112. For example, the cavity 114 may be formed in any size by removing a portion of the inactive surface 113 in a center region 112c of the substrate 112. The portion of the inactive surface 113 may be removed by fine machining techniques such as a micromachining technique, or a micro electro mechanical system (MEMS) technique, or any other suitable machining technique. The center region 112c of the substrate 112 may have a first thickness T1, and the peripheral region 112p surrounding the center region 112c or occupying a plurality of sides of the center region 112c may have a second thickness T2 that is larger than the first thickness T1.

In the first semiconductor integrated circuit chip 110, the substrate 112 may include at least one first through electrode 118 which is electrically connected to the third semiconductor integrated circuit chip 130 to provide internal I/O (input/output). The substrate 112 may include at least one second through electrode 116 that is electrically connected to the package substrate 140 to provide external I/O. Throughout the specification, the internal I/O is to input/output data between chips, e.g., the first semiconductor integrated circuit chip 110 and the third semiconductor integrated circuit chip 130. The external I/O is to input/output data between a chip and a package substrate, e.g., the first semiconductor integrated circuit chip 110 and the package substrate 140.

The at least one first through electrode 118 may be formed by forming at least one first via 117 at the center region 112c having a first thickness T1 of the substrate 112 and filling the at least one first via 117 with a conductive material (e.g., silicon). Similarly, at least one second through electrode 116 may be formed by forming at least one second via 115 at the peripheral region 112p having the second thickness T2 of the substrate 112 and filling the at least one second via 115 with a conductive material. The vias 115 and 117 may be formed by laser or dry etching.

The third semiconductor integrated circuit chip 130 may be a memory chip that is disposed in the cavity 114 to be electrically connected to the first semiconductor integrated circuit chip 110. The third semiconductor integrated circuit chip 130 may be mounted and/or disposed on the first semiconductor integrated circuit chip 110 in, for example, a flip chip manner. For example, the third semiconductor integrated circuit chip 130 may be electrically connected to the first semiconductor integrated circuit chip 110 by at least one first through electrode 118. Alternatively, the third semiconductor integrated circuit chip 130 may be electrically connected to the first semiconductor integrated circuit chip 110 by at least one micro bump 150 connected to the at least one first through electrode 118.

The second semiconductor integrated circuit chip 120 may be a memory chip mounted and/or disposed on the active surface 111 of the first semiconductor integrated circuit chip 110. The second semiconductor integrated circuit chip 120 may be electrically connected to the first semiconductor integrated circuit chip 110 by at least one second micro bump 160. As an example, the second semiconductor integrated circuit chip 120 may be mounted and/or disposed on the first semiconductor integrated circuit chip 110 in a flip chip manner.

The package substrate 140 may be, for example, a printed circuit board (PCB). The package substrate 140 may be electrically connected to the first semiconductor integrated circuit chip 110 by at least one second through electrode 116. Alternatively, the package substrate 140 may be electrically connected to the first semiconductor integrated circuit chip 110 by the at least one second through electrode 116 and the at least one bulk bump 170 connected to the second through electrode 116.

The first through electrodes 118 electrically connect the first semiconductor integrated circuit chip 110 to the third semiconductor integrated circuit chip 130. The first through electrode 118 may be formed to have a pitch of, for example 100 μm or less, so as to form a broadband I/O bus. In addition, the first through electrodes 118 may be formed in a region having an increased circuit density because the first through electrode 118 electrically connects integrated circuits to one another. The first vias 117 having a minimized diameter may be formed to the first through electrode 118 as described above. The first via 117 may be formed by a via-first step that forms a via at the beginning of a front-end process. Since the first through electrode 118 is disposed in the center region 112c of the substrate 112 having the first thickness T1, the height of the first through electrode 118 may be smaller than the height of the second through electrode 116. An increased data-transfer rate may be obtained by the first through electrode 118 having a low height and a fine pitch to improve an electrical performance of the semiconductor package 100.

Since the second through electrode 116 connects a logic circuit of the first semiconductor integrated circuit chip 110 to an external circuit of the package substrate 140, it may be used in a region having a relatively large design rule and a relatively small circuit density. The second through electrode 116 may have a larger pitch than the first through electrode 118. The second via 115 to include the second through electrode 116 may be formed by a via-last step to form a via at a back-end step of a manufacturing process to have an increased height and pitch than the first via 117. Since the second through electrode 116 is disposed in peripheral region 112p of the substrate 112 having the second thickness T2, the height of the second through electrode 116 may be increased with the first through electrode 118. The bulk bump 170 may be connected to the second through electrode 116. The volume and height of the bulk bump 170 are relatively larger than those of the first micro bump 150. The second through electrode 116 may have a larger size than the first through electrode 118, and the peripheral region 112p of the substrate 112 may be maintained at the second thickness T2. In addition, the relatively larger bulk bump 170 may be further disposed between the substrate 112 and the package substrate 140. For at least these reasons, the first semiconductor integrated circuit chip 110 may endure an applied stress and have an improved mechanical durability.

The external I/O of the semiconductor package 100 may be accomplished using the second through electrodes 116 and/or the bulk bumps 170. In one or more exemplary embodiments of the present general inventive concept, there is no limitation in size of the respective chips 110 to 130. For example, the size of the third semiconductor integrated circuit chip 130 is smaller than that of the first semiconductor integrated circuit chip 110. However, if their size difference is decreased, the third semiconductor integrated circuit chip 130 may be mounted on the first semiconductor integrated circuit chip 110 by regulating the size of the cavity 114 and the pitch of the second through electrode 116. The second semiconductor integrated circuit chip 120 may have any size, regardless of the size of the first semiconductor integrated circuit chip 110.

Figure 2:
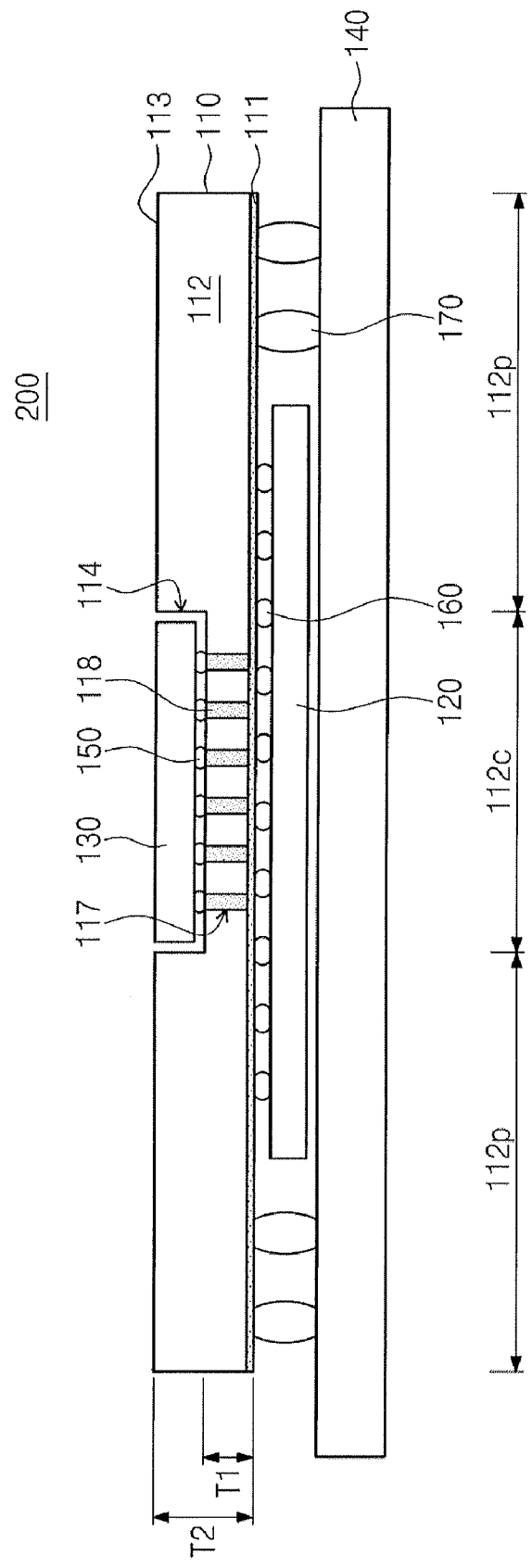
FIG. 2 is a cross-sectional view illustrating a semiconductor package according to exemplary embodiments of the present general inventive concept.

FIG. 2 is a cross-sectional view illustrating a semiconductor package according to exemplary embodiments of the present general inventive concept. The exemplary embodiments illustrated in FIG. 2 are similar to those illustrated in FIG. 1, and the differences therebetween will be described in detail below.

Referring to FIG. 2, a semiconductor package 200 may include a package substrate 140 on which a first semiconductor integrated circuit chip 110 is mounted and/or disposed in a second direction (i.e., "face-down" state). A second semiconductor integrated circuit chip 120 and a third semiconductor integrated circuit chip 130 are stacked and/or disposed on the first semiconductor integrated circuit chip 110. Differently from the exemplary embodiments of the present general inventive concept illustrated in FIG. 1, the first semiconductor integrated circuit chip 110 may be reversely mounted on the package substrate 140 as illustrated in FIG. 2.

The third semiconductor integrated circuit chip 130 may be inserted into and/or disposed on a cavity 114 formed on an inactive surface 113 of the first semiconductor integrated circuit chip 110, and the second semiconductor integrated circuit chip 120 may be disposed on an active surface 111 of the first semiconductor integrated circuit chip 110. The first semiconductor integrated circuit chip 110 and the third semiconductor integrated circuit chip 130 may be electrically connected to each other by at least one first through electrode 118 having a fine pitch or at least one first micro bump 150 connected to the at least one first through electrode 118. The first semiconductor integrated circuit chip 110 and the second semiconductor integrated circuit chip 120 may be electrically connected to each other by the at least one second micro bump 160.

A substrate 112 of the first semiconductor integrated circuit chip 110 may include a center region 112c having a first thickness T1 and a peripheral region 112p having a second thickness T2. The cavity 114 is formed within the boundaries of the center region 112c. The third semiconductor integrated circuit chip 130 is mounted and/or disposed on the center region 112c of the substrate 112. At least a portion of a mechanical stress arising from the center region 112c may be reduced by the peripheral region 112p to increase mechanical strength of the first semiconductor integrated circuit chip 110.

The exemplary embodiments of the present general inventive concept illustrated in FIG. 2 is different from the exemplary embodiments of the present general inventive concept illustrated in FIG. 1 in that the active surface 111 of the first semiconductor integrated circuit chip 110 faces the package substrate 140, and the second through electrode (active surface 111 in FIG. 1) may be unnecessary. Therefore, unlike the exemplary embodiments illustrated in FIG. 1, the exemplary embodiments of the present general inventive concept illustrated in FIG. 2 may include an external I/O with a bulk bump 170 without through electrodes.

In the exemplary embodiments illustrated in FIG. 2, the size of the third semiconductor integrated circuit chip 130 may be less than or equal to that of the first semiconductor integrated circuit chip 110. The size of the second semiconductor integrated circuit chip 120 may be less than or equal to that of the first semiconductor integrated circuit chip 110. However, if their size difference is less than or equal to a predetermined value, the second semiconductor integrated circuit chip 120 may be mounted and or disposed on the first semiconductor integrated circuit chip 110 by regulating the pitch of the bulk bump 170.

Figure 3:
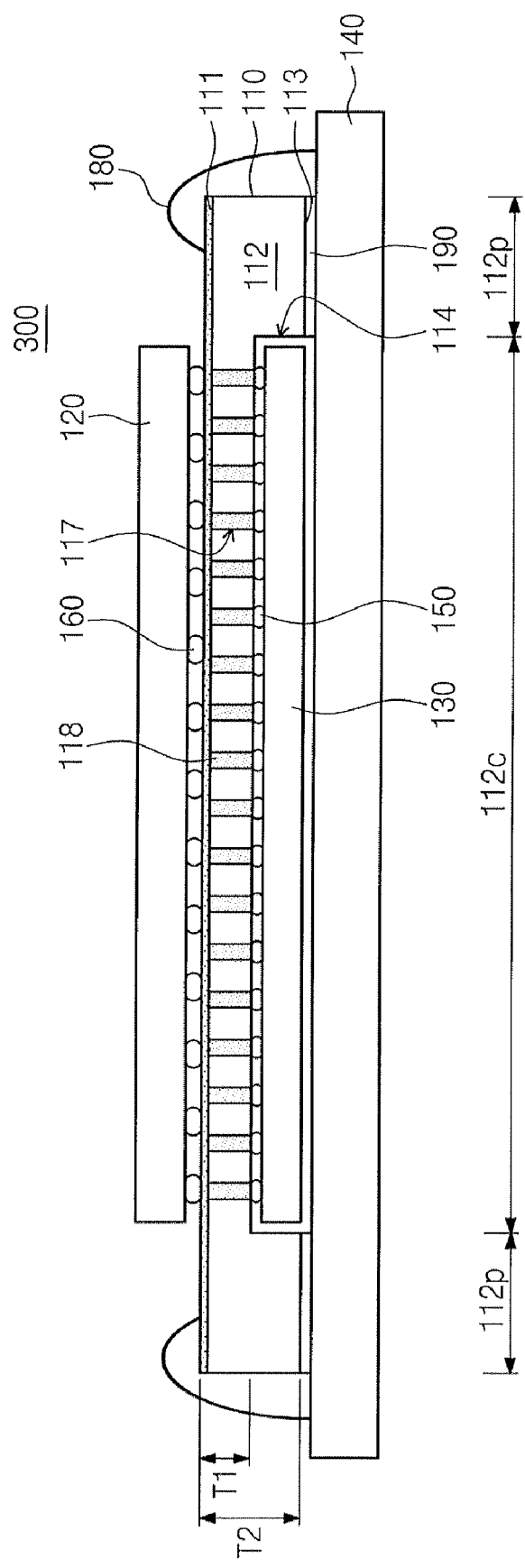
FIG. 3 is a cross-sectional view illustrating a semiconductor package according to exemplary embodiments of the present general inventive concept.

FIG. 3 is a cross-sectional view illustrating a semiconductor package according to exemplary embodiments of the present general inventive concept. The exemplary embodiments illustrated in FIG. 3 are similar to the exemplary embodiments illustrated in FIG. 1, and the differences therebetween will be described below in detail.

Referring to FIG. 3, a semiconductor package 300 includes external I/O using at least one bonding wire 180. For example, the first semiconductor integrated circuit chip 110 may be mounted and/or disposed on a package substrate 140 facing in a first direction (e.g., in a face-up state), a second semiconductor integrated circuit chip 120 may be mounted and/or disposed on an active surface 111 of the first semiconductor integrated circuit chip 110, and a third semiconductor integrated circuit chip 130 may be mounted and/or disposed on an inactive surface 113 of the first semiconductor integrated circuit chip 110 when inserted into a cavity 114 formed thereon.

Similarly to the exemplary embodiments illustrated in FIG. 1, the first semiconductor integrated circuit chip 110 and the third semiconductor integrated circuit chip 130 illustrated in FIG. 3 may be electrically connected to each other by at least one first through electrode 118 having a fine pitch or at least one first micro bump 150 connected to at least one first through electrode 118. The first semiconductor integrated circuit chip 110 and the second semiconductor integrated circuit chip 120 may be electrically connected to each other by at least one second micro bump 160.

Differing from the exemplary embodiments illustrated in FIG. 1, the external I/O of the exemplary embodiments illustrated in FIG. 3 may include at least one bonding wire 180 which electrically connects the first semiconductor integrated circuit chip 110 to the package substrate 140. An adhesive layer 190 may be disposed between the first semiconductor integrated circuit chip 110 and the package substrate 140.

When the cavity 114 does not exist, the third semiconductor integrated circuit chip 130 may be mounted and/or disposed on the inactive surface 113 of the first semiconductor integrated circuit chip 110. When the first through electrode 118 is formed to have a pitch for a broadband data bus (e.g., a fine pitch), it is desirable that a substrate 112 of the first semiconductor integrated circuit chip 110 be processed to have a predetermined thickness (e.g., processed to be thin). Mechanical stress may be applied to the substrate 112 during a wire bonding process to form a bonding wire 180. When the size of the third semiconductor integrated circuit chip 130 is less than or equal to that of the first semiconductor integrated circuit chip 110 and the difference in size therebetween is greater than or equal to a predetermined difference value, increased values of mechanical stress may be applied to the substrate 112.

The peripheral region 112p of the substrate 112 may be maintained at the second thickness T2 by forming the cavity 114 within the center region 112c of the substrate 112 and inserting the third semiconductor integrated circuit chip 130 into the cavity 114. The second thickness T2 of the peripheral region 112p may enable the substrate 112 to be durable against the predetermined range of stress applied during the wire bonding process.

In the exemplary embodiments illustrated in FIG. 3, a space may be disposed where the at least one bonding wire 180 is formed. The second semiconductor integrated circuit chip 120 may have a size that is less than or equal to the first semiconductor integrated circuit chip 110. The third semiconductor integrated circuit chip 130 may have a size that is less than or equal to the first semiconductor integrated circuit chip 110, or the difference in size therebetween may be less than or equal to a predetermined amount.

Figure 4:
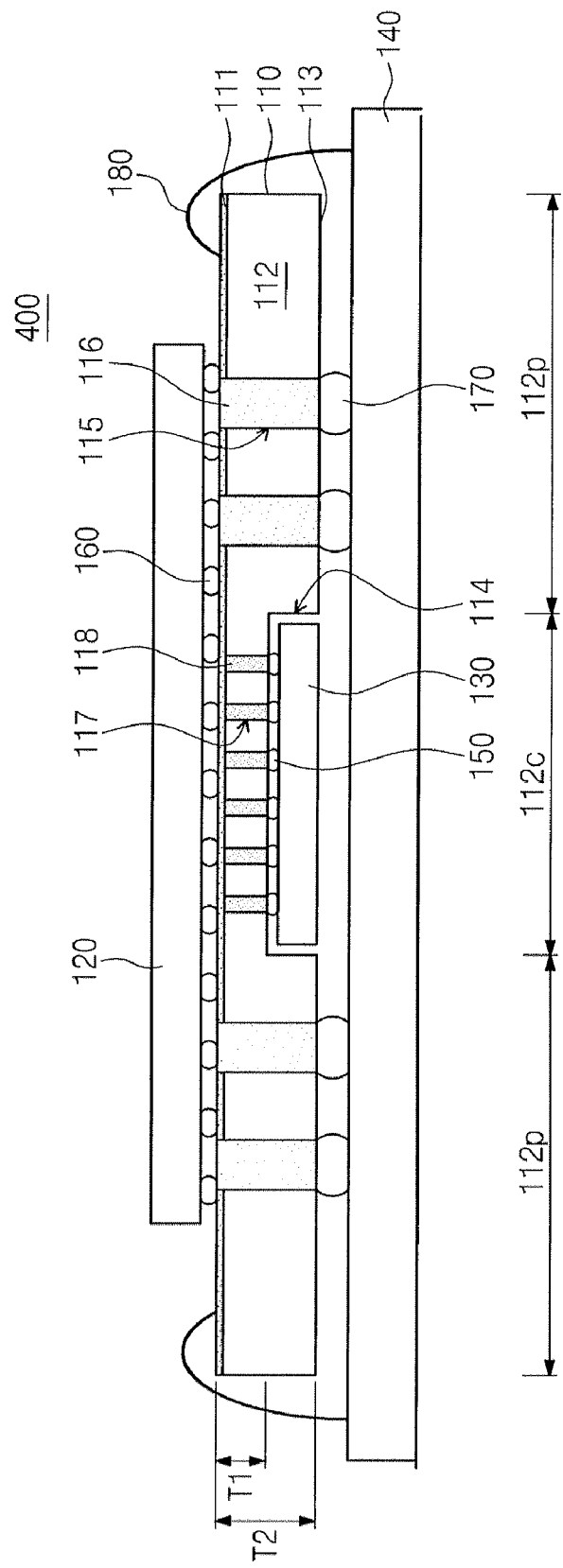
FIG. 4 is a cross sectional view illustrating a semiconductor package according to exemplary embodiments of the present general inventive concept.

FIG. 4 is a cross-sectional view illustrating a semiconductor package according to exemplary embodiments of the present general inventive concept. The exemplary embodiments illustrated in FIG. 4 may be similar to the exemplary embodiments illustrated in FIG. 1, and the differences therebetween will be described below in detail.

Referring to FIG. 4, a semiconductor package 400 may provide external I/O with at least one second through electrode 116 and at least one bonding wire 180. For example, the first semiconductor integrated circuit chip 110 may be mounted and/or disposed on a package substrate 140 facing in a first direction (e.g., in a face-up state), a second semiconductor integrated circuit chip 120 may be mounted and/or disposed on an active surface 111 of the first semiconductor integrated circuit chip 110, and a third semiconductor integrated circuit chip 130 may be mounted and/or disposed on an inactive surface 113 of the first semiconductor integrated circuit chip 110 when inserted into a cavity 114 formed thereon.

Similarly to the exemplary embodiments illustrated in FIG. 1, the first semiconductor integrated circuit chip 110 and the third semiconductor integrated circuit chip 130 illustrated in FIG. 4 may be electrically connected to each other by at least one first through electrode 118 having a fine pitch or at least one first micro bump 150 connected to the at least one first through electrode 118. The first semiconductor integrated circuit chip 110 and the second semiconductor integrated circuit chip 120 may be electrically connected to each other by at least one second micro bump 160.

The first semiconductor integrated circuit chip 110 may have a size that is greater than or equal to the third semiconductor integrated circuit chip 130. When it is difficult to obtain a sufficient number of second through electrodes 116, the semiconductor package 400 may be further provided with at least one bonding wire 180 in a hybrid fashion to provide external I/O.

In the exemplary embodiments illustrated in FIG. 4, a space may be disposed where the at least one bonding wire 180 is to be formed. The second semiconductor integrated circuit chip 120 may be a size that is less than or equal to the first semiconductor integrated circuit chip 110. The third semiconductor integrated circuit chip 130 may have a size that is less than or equal to the first semiconductor integrated circuit chip 110. When the difference in size is less than or equal to a predetermined difference value, the third semiconductor integrated circuit chip 130 may be mounted and/or disposed on the first semiconductor integrated circuit chip 110 by regulating the size of the cavity 114 and the pitch of the second through electrode 116.

FIGS. 5 to 8 are cross-sectional views illustrating examples of a mirror-image stacked type semiconductor package, respectively, according to exemplary embodiments of the present general inventive concept.

Figure 5:
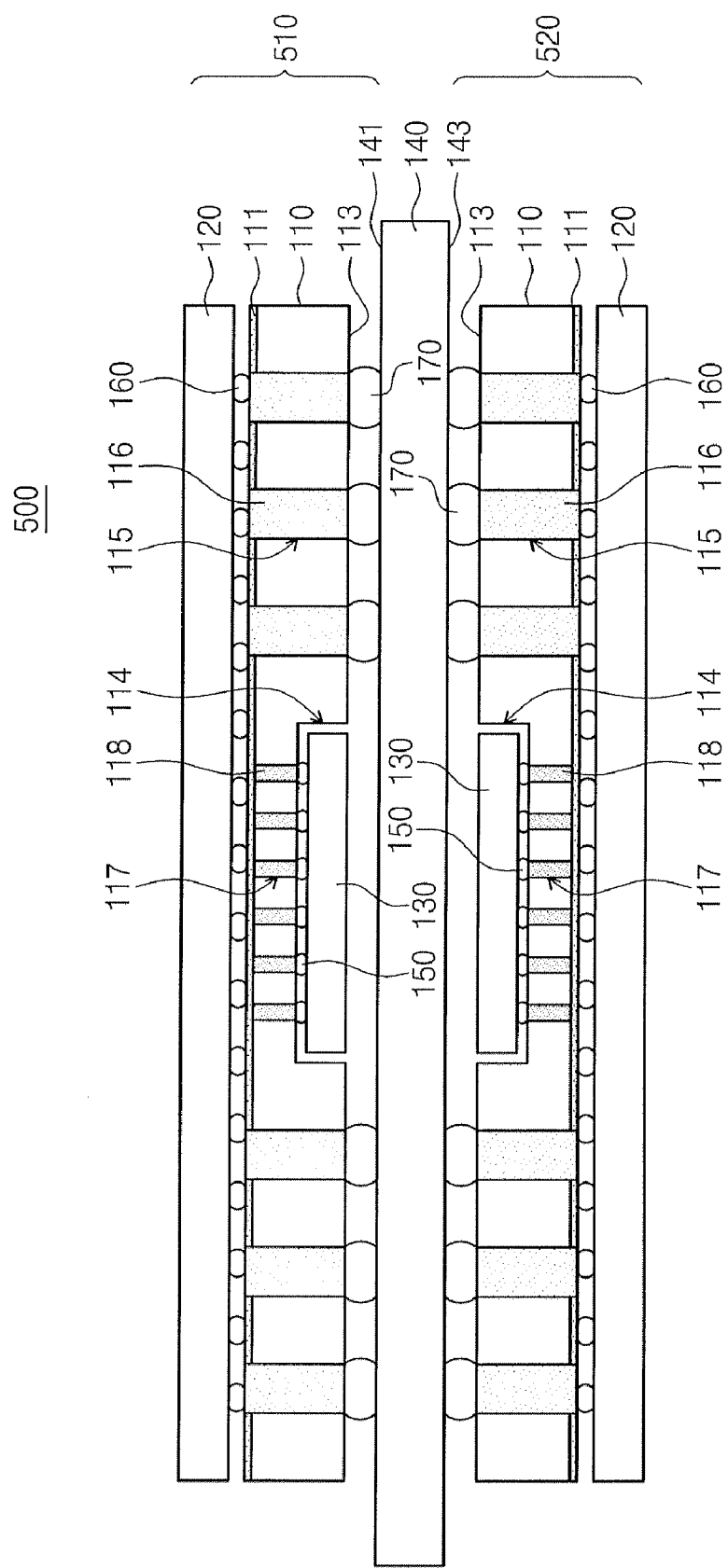
FIGS. 5 to 8 are cross-sectional views illustrating examples of a mirror-image stacked type semiconductor package, respectively, according to exemplary embodiment of the present general inventive concept.

Referring to FIG. 5, a semiconductor package 500 according to exemplary embodiments of the present general inventive concept is a mirror-image type of the semiconductor package 100 illustrated in FIG. 1 on a package substrate 140. For example, a first package 510 may be mounted and/or disposed on a first surface 141 of the package substrate 140, and a second package 520 may be mounted and/or disposed on a second surface 143 of the package substrate 140. The first surface 141 may be an upper surface, and the second surface 143 may be a lower surface.

The first package 510 may be organized with an identical or similar structure to that in the semiconductor package 100 illustrated in FIG. 1. For example, a first semiconductor integrated circuit chip 110 may be mounted on the first surface 141 of the package substrate 140 facing in a first direction (e.g. in a face-up state). Second and third semiconductor integrated circuit chips 120 and 130 may be stacked and/or disposed on a plurality of surfaces of the first semiconductor integrated circuit chip 110. The third semiconductor integrated circuit chip 130 may be inserted into the cavity 114 formed and/or disposed on an inactive surface 113 of the first semiconductor integrated circuit chip 110. The first semiconductor integrated circuit chip 110 and the third semiconductor integrated circuit chip 130 may be electrically connected to each other by at least one first through electrode 118 or at least one first micro bump 150 connected to the at least one first through electrode 118. The first semiconductor integrated circuit chip 110 and the second semiconductor integrated circuit chip 120 may be electrically connected to each other by at least one second micro bump 160. The first semiconductor integrated circuit chip 110 may further include at least one second through electrode 116 and may be electrically connected to the package substrate 140 by the at least one second through electrode 116 or at least one bulk bump 170 connected to the at least one second through electrode 116. The second package 520 may be vertically symmetrical to the first package 510. Each of the first and second packages 510 and 520 may be identical or similar to the semiconductor package 100 illustrated in FIG. 1 and described above.

Figure 6:
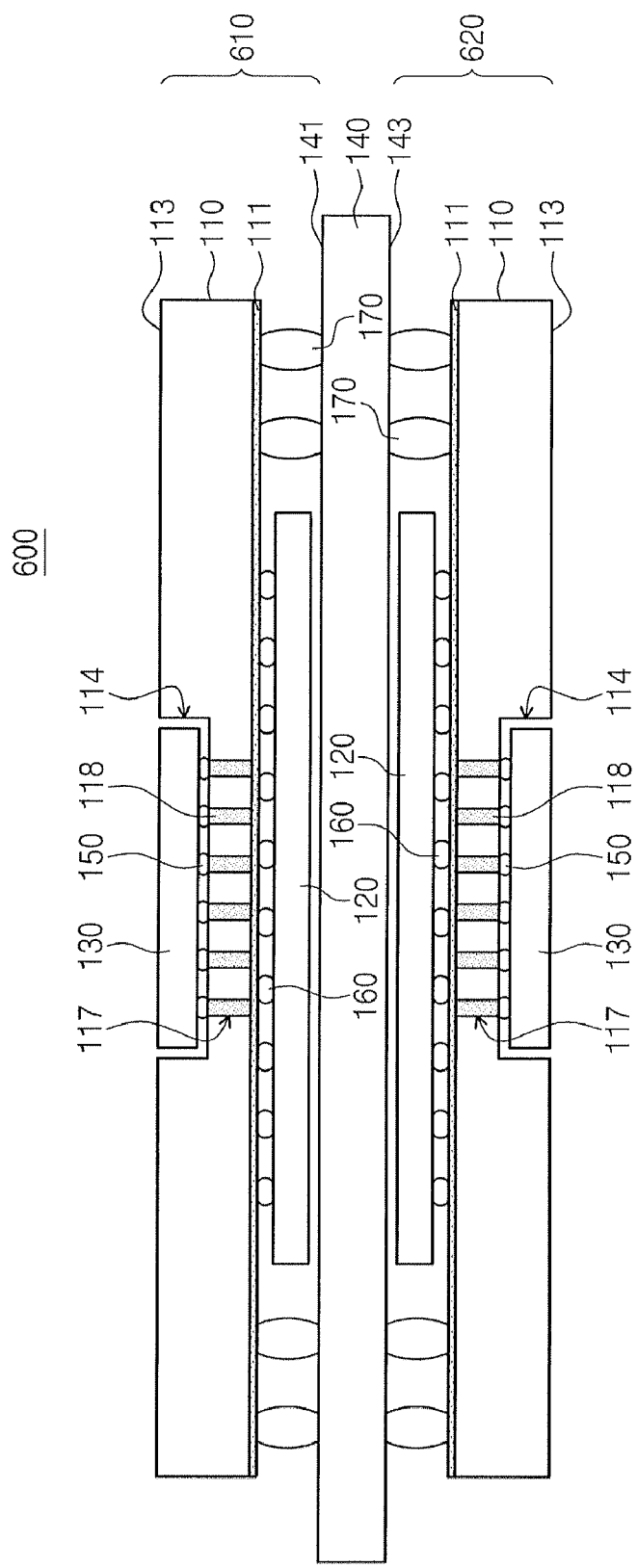

Referring to FIG. 6, a semiconductor package 600 according to exemplary embodiments of the present general inventive concept is a mirror-image type of the semiconductor package 200 illustrated in FIG. 2 around a package substrate 140.

For example, the semiconductor package 600 includes a first package 610 and a second package 620. In the first package 610, a first semiconductor integrated circuit chip 110, which is electrically connected to the package substrate 140 by at least one bulk bump 170, is mounted and/or disposed on an first surface 141 of the package substrate 140 facing in a second direction (e.g., in a face-down manner), and second and the third semiconductor integrated circuit chips 120, 130 are stacked on at least one surface of the first semiconductor integrated circuit chip 110. In the second package 620, the first semiconductor integrated circuit chip 110, which is electrically connected to the package substrate 140 by the at least one bulk bump 170, is mounted and/or disposed on a second surface 143 of the package substrate 140 facing a second direction (e.g., in a face-down manner), and the second and third semiconductor integrated circuit chips 120 and 130 are stacked on at least one surface of the first semiconductor integrated circuit chip 110. The lower package 620 may be vertically symmetrical to the first package 610. Each of the first and second packages 610 and 620 is identical or similar to the semiconductor package 200 illustrated in FIG. 2 and described in detail above. The first surface 141 may be an upper surface of the package substrate 140, and the second surface 143 may be a lower surface of the package substrate 140.

Figure 7:
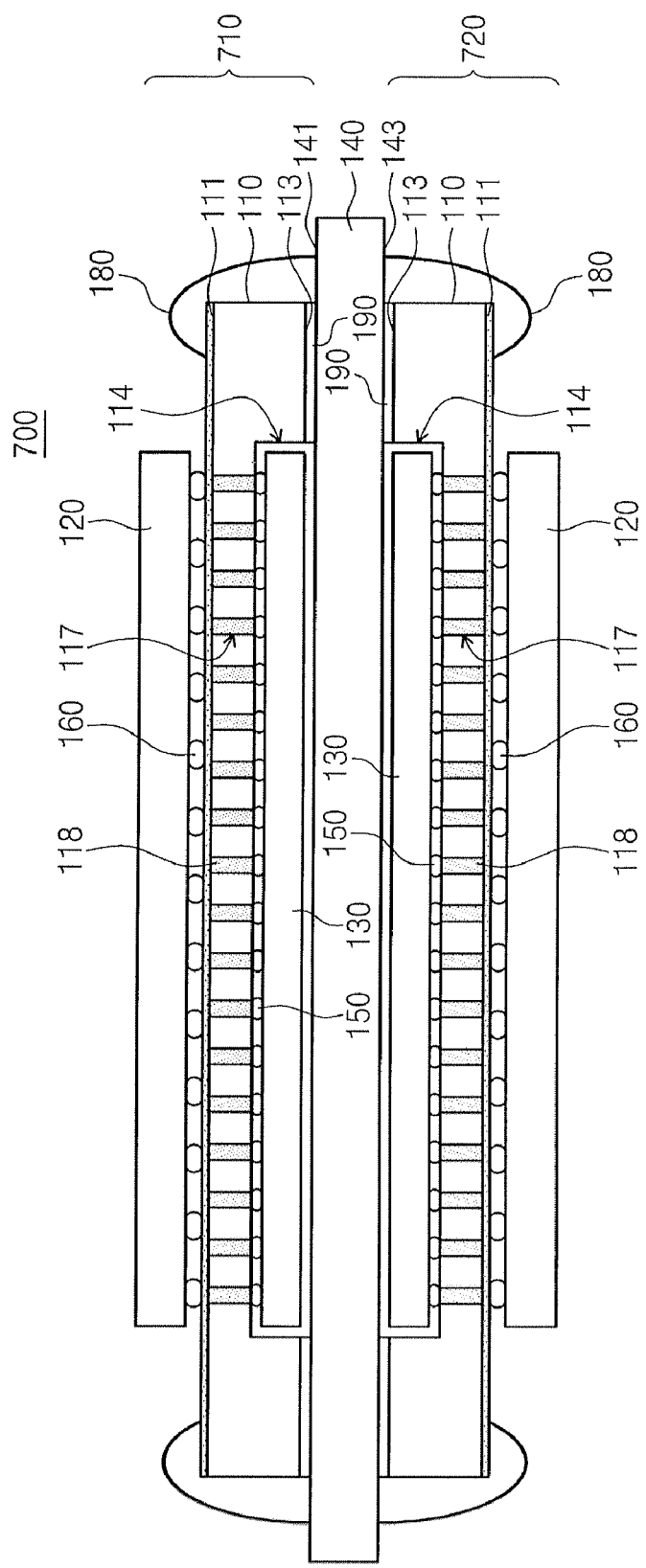

Referring to FIG. 7, a semiconductor package 700 according to exemplary embodiments of the present general inventive concept is a mirror-image type of the semiconductor package 300 illustrated in FIG. 3 around a package substrate 140. Similarly to the semiconductor package 300, the semiconductor package 700 includes an first package 710 mounted on an first surface 141 of the package substrate 140 facing in a first direction (e.g., in a face-up state) and a second package 720 mounted on a second surface 143 of the package substrate 140. In the first package 710, second and third semiconductor integrated circuit chips 120 and 130 are stacked on at least one surface of the first semiconductor integrated circuit chip 110, and the first semiconductor integrated circuit chip 110 is electrically connected to the package substrate 140 by at least one bonding wire 180. The first package 710 and the second package 720 are vertically symmetrical to each other. The description of the first and second packages 710 and 720 may be identical or similar to the semiconductor package 300 illustrated in FIG. 3 and described in detail above.

Figure 8:
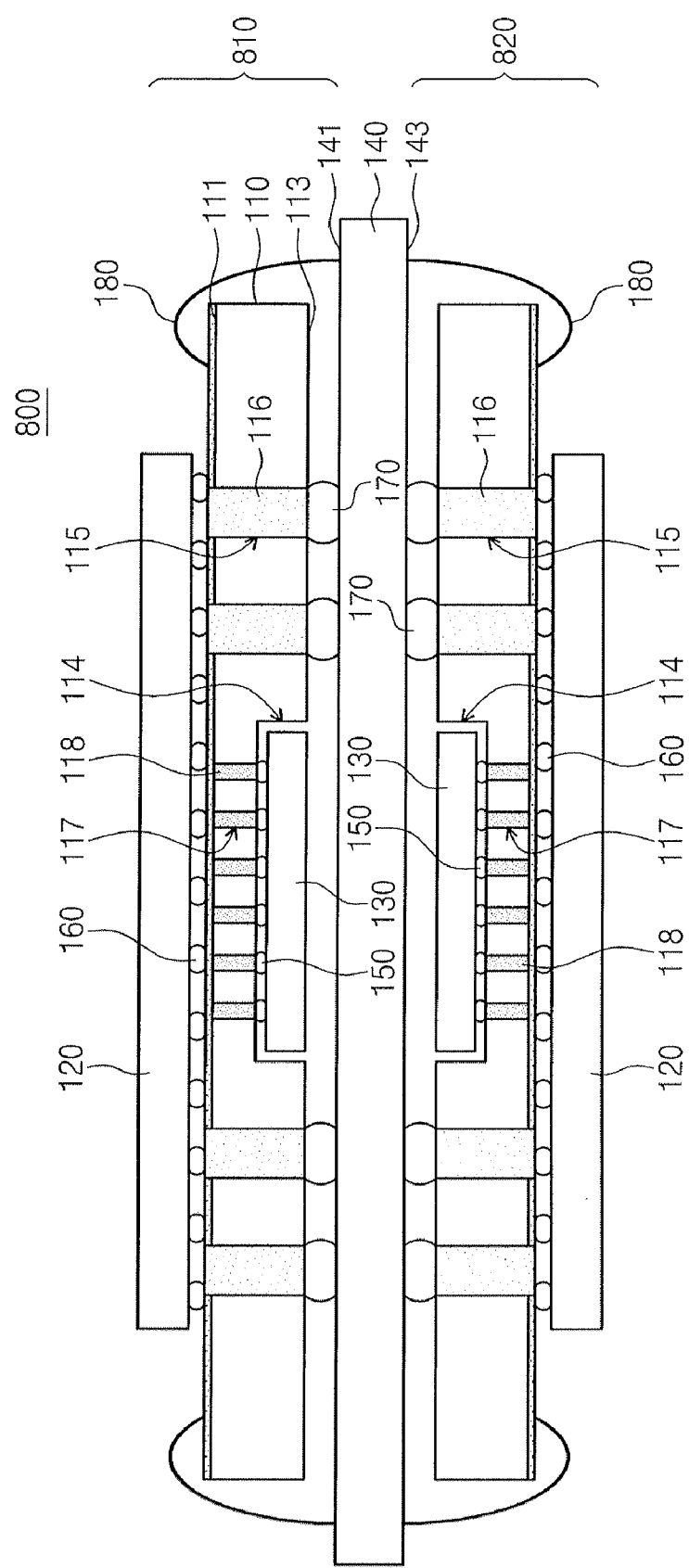

Referring to FIG. 8, a semiconductor package 800 according to exemplary embodiments of the present general inventive concept is a mirror-image type of the semiconductor package 400 illustrated in FIG. 4 around a package substrate 140. For example, a first package 810 may be mounted on a first surface 141 of a package substrate 140 and a second package 820 may be mounted on a second surface 143 thereof. The first package 810 is identical or similar to semiconductor package 400 illustrated in FIG. 4 and described in detail above, and the second package 820 may be vertically symmetrical to the first package 810. The description of the first and second packages 810 and 820 may be substituted for the semiconductor package 400 illustrated in FIG. 4.

FIGS. 9 to 12 are cross-sectional views illustrating examples of a vertically stacked type semiconductor package, respectively, according to exemplary embodiments of the present general inventive concept.

Figure 9:
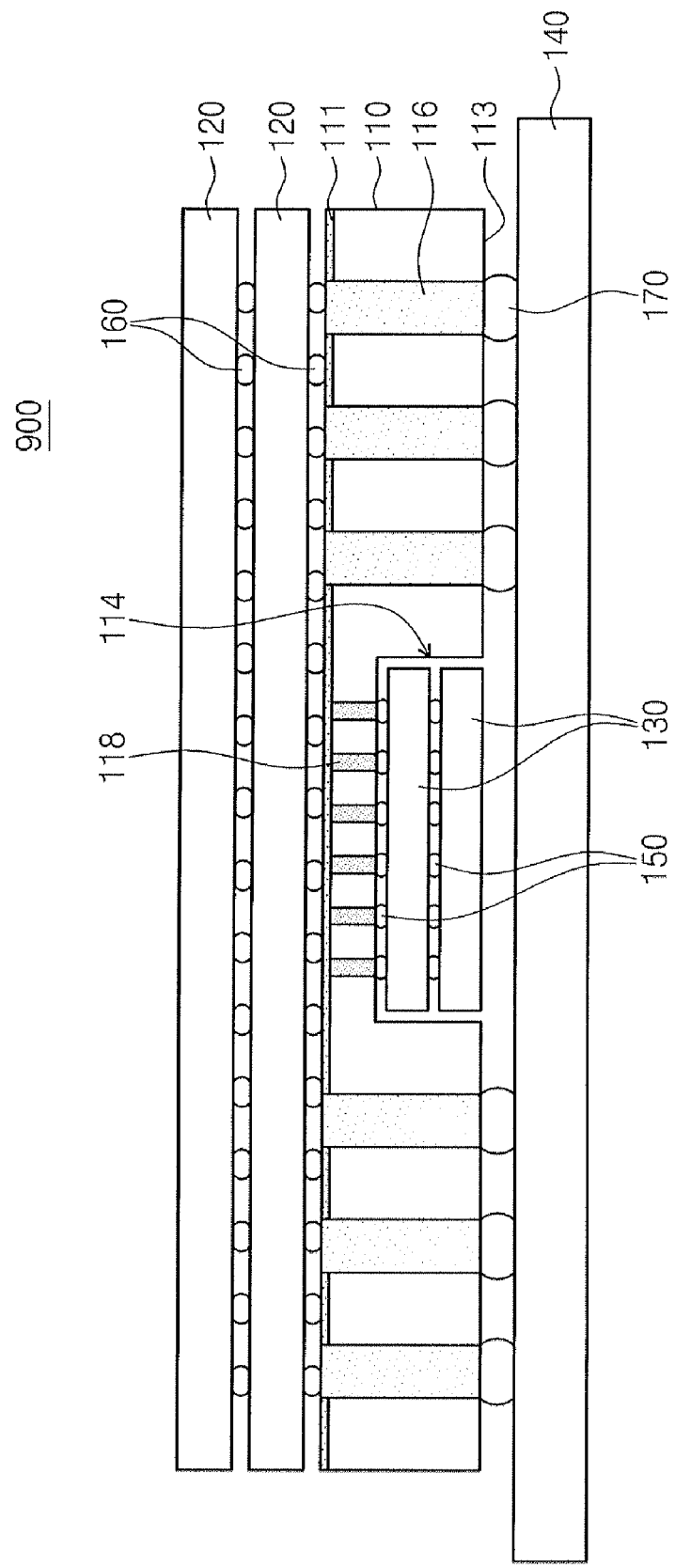
FIGS. 9 to 12 are cross-sectional views illustrating examples of a vertically stacked type semiconductor package, respectively, according to exemplary embodiments of the present general inventive concept.

Referring to FIG. 9, a semiconductor package 900 according to exemplary embodiments of the present general inventive concept may include a plurality of second semiconductor integrated circuit chips 120 and/or a plurality of third semiconductor integrated circuit chips 130 that are stacked in and/or disposed on the semiconductor package 100 illustrated in FIG. 1. For example, the first semiconductor integrated circuit chip 110 may be mounted and/or disposed on a package substrate 140 facing in a first direction (e.g., in a face-up state), at least two second semiconductor integrated circuit chips 120 may be stacked on an active surface 111 of the first semiconductor integrated circuit chip 110, and/or at least two third semiconductor integrated circuit chips 130 may be stacked and/or disposed within a cavity 114.

The second semiconductor integrated circuit chips 120 may be the same kind or different kinds of chips. That is, the second semiconductor integrated circuit chips 120 may be memory chips or logic chips, or one of the second semiconductor integrated circuit chips 120 may be a memory chip and another may be a logic chip. The first semiconductor integrated circuit chip 110 may electrically be connected to the second semiconductor integrated circuit chips 120 by at least one second micro bump 160. The second semiconductor integrated circuit chips 120 may electrically be connected to each other by at least one second micro bump 160. Although not illustrated in FIG. 9, the second semiconductor integrated circuit chips 120 may include at least one through electrode connected to at least one second micro bump 160. The above description of the second semiconductor integrated circuit chips 120 may be applied to the third semiconductor integrated circuit chip 130.

Figure 10:
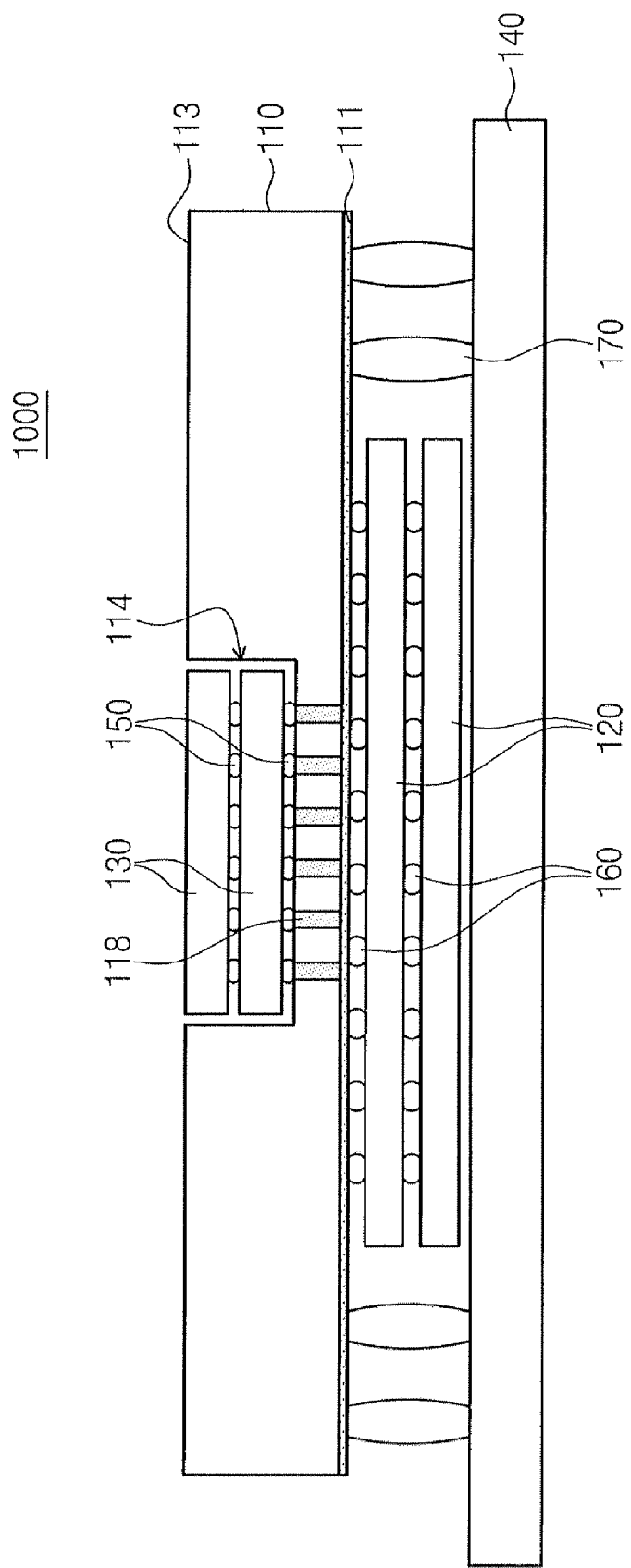

Referring to FIG. 10, a semiconductor package 1000 according to exemplary embodiments of the present general inventive concept may include a plurality of second semiconductor integrated circuit chips and/or a plurality of third semiconductor integrated circuit chips 130 that are stacked in and/or disposed on the semiconductor package 200 illustrated in FIG. 2. For example, the first semiconductor integrated circuit chip 110 may be mounted on a package substrate 140 facing in a second direction (e.g., in a face-down state), at least two second semiconductor integrated circuit chips 120 may be stacked and/or disposed on an active surface 111 of a first semiconductor integrated circuit chip 110, and/or at least two third semiconductor integrated circuit chips 130 may be stacked within and/or disposed in a cavity 114.

Figure 11:
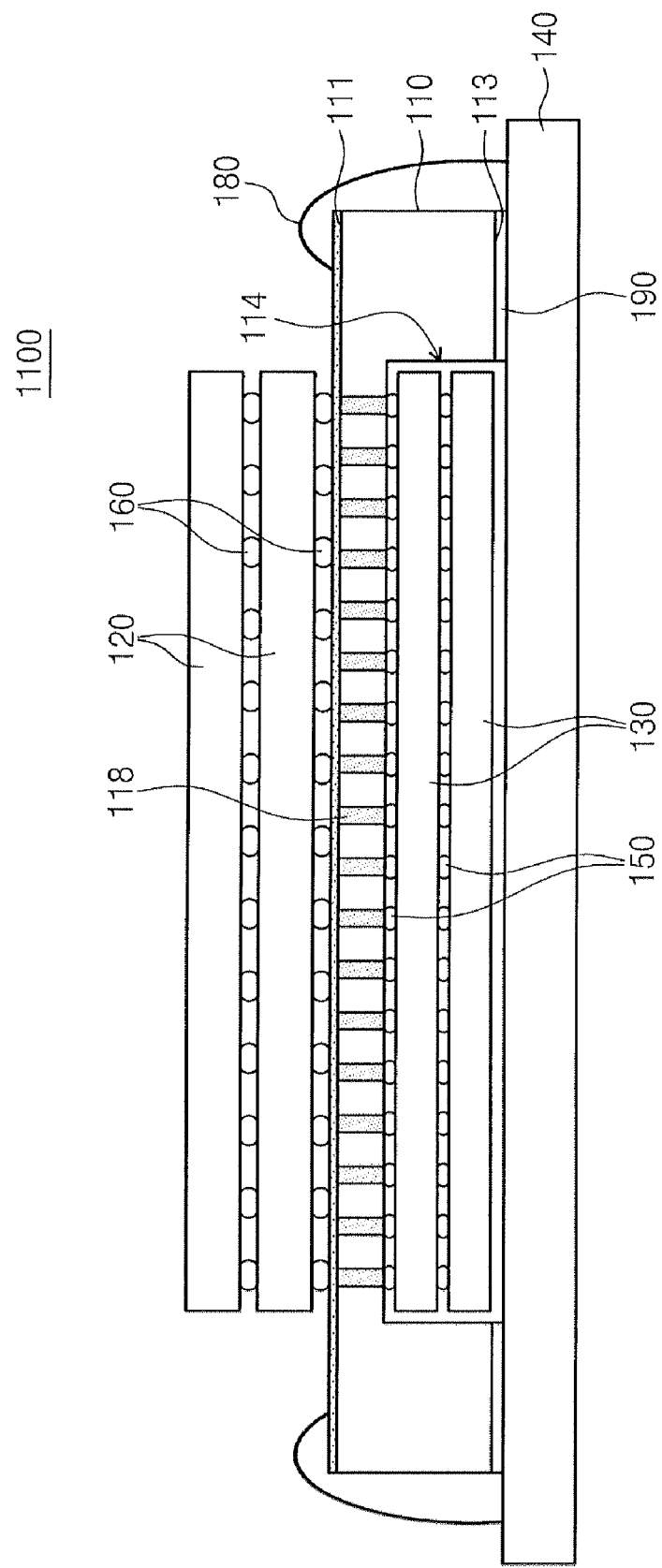

Referring to FIG. 11, a semiconductor package 1100 according to exemplary embodiments of the present invention that may be similar to the semiconductor package 1000 illustrated in FIG. 10, where the semiconductor package 1100 may include a plurality of second semiconductor integrated circuit chips 120 and/or a plurality of third semiconductor integrated circuit chips 130 that are stacked and/or disposed in the semiconductor package 300 illustrated in FIG. 3.

Figure 12:
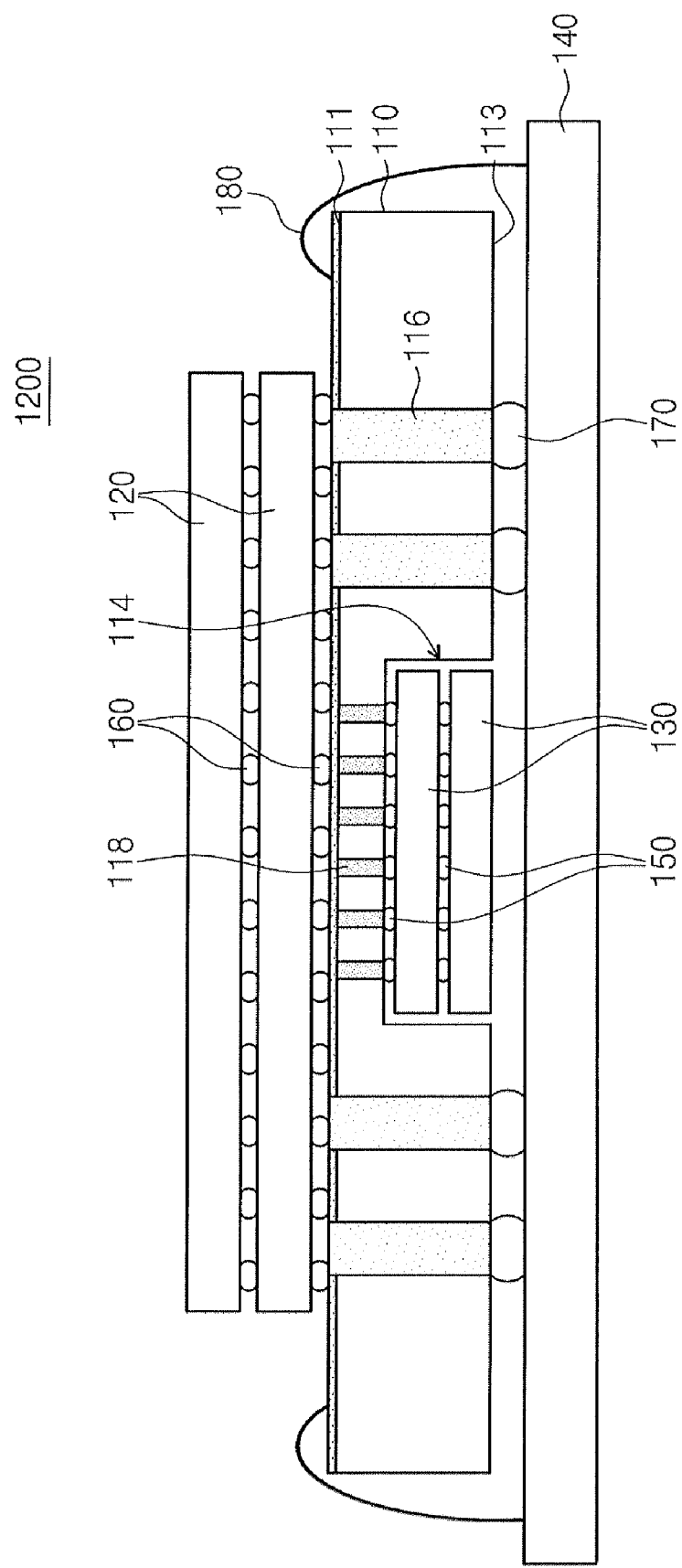

Referring to FIG. 12, a semiconductor package 1200 that may be similar to the semiconductor package 1000 illustrated in FIG. 10, where the semiconductor package 1200 may include a plurality of second semiconductor integrated circuit chips 120 and/or a plurality of third semiconductor integrated circuit chips 130 that are stacked and/or disposed in the semiconductor package 400 illustrated in FIG. 4.

Figure 13:
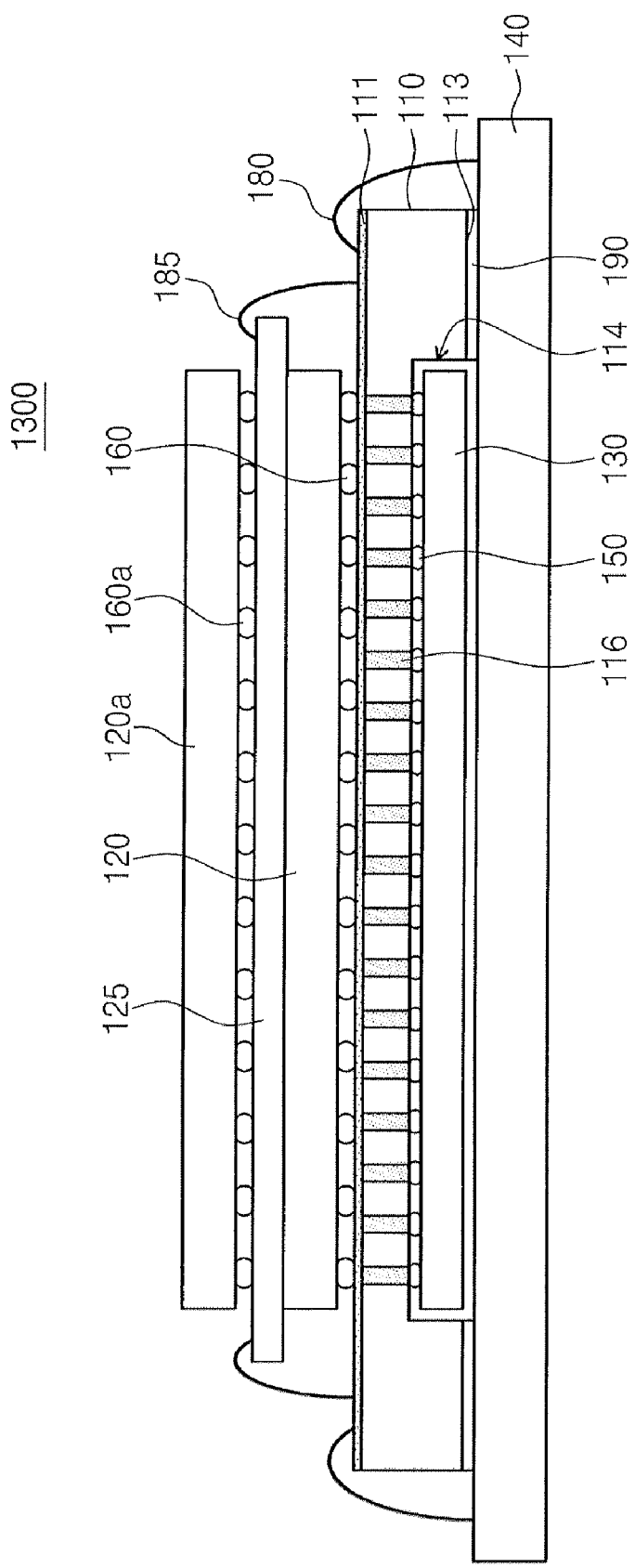
FIGS. 13 and 14 are cross-sectional views illustrating examples of a wire-bonding stacked type semiconductor package, respectively, according to exemplary embodiments of the present general inventive concept.
Figure 14:
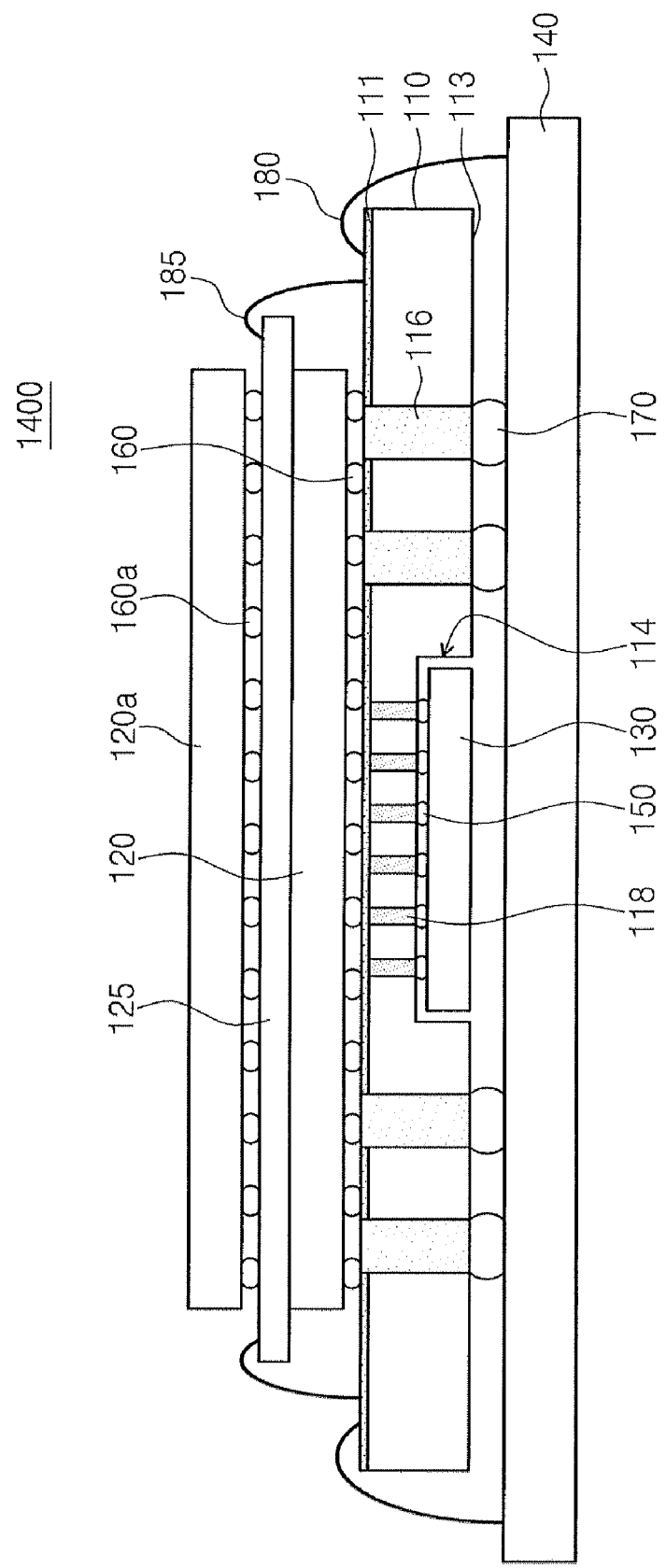

FIGS. 13 and 14 are cross-sectional views illustrating examples of a wire-bonding stacked type semiconductor package, respectively, according to exemplary embodiments of the present general inventive concept.

Referring to FIG. 13, a semiconductor package 1300 according to exemplary embodiments of the present general inventive concept may include a first semiconductor integrated circuit chip 110, a plurality of (e.g., at least two) semiconductor integrated circuit chips 120 and 120a, and an interposer 125 that are stacked in and/or disposed on the semiconductor package 300 illustrated in FIG. 3. The second semiconductor integrated circuit chips 120 and 120a are stacked in and/or disposed on an active surface 111 of the first semiconductor integrated circuit chip 110, and the interposer 125 is disposed between the two second semiconductor integrated circuit chips 120 and 120a. The second semiconductor integrated circuit chip 120a may electrically be connected to the interposer 125 by at least one bump 160a, and the interposer 125 may be electrically connected to the first semiconductor integrated circuit chip 110 by at least one bonding wire 185. It is not necessary to form a through electrode in the second semiconductor integrated circuit chips 120 and 120a. The description of the semiconductor package 300 illustrated in FIG. 3 and described in detail above may be applied to the semiconductor package 1300.

Referring to FIG. 14, a semiconductor package 1400 according to exemplary embodiments of the present general inventive concept may include a first semiconductor integrated circuit chip 110, a plurality of (e.g., at least two) second semiconductor integrated circuit chips 120 and 120a, and an interposer 125 that are stacked in and/or disposed on the semiconductor package 400 illustrated in FIG. 4. The two second semiconductor integrated circuit chips 120 and 120a are stacked and/or disposed on an active surface 111 of the first semiconductor integrated circuit chip 110. The interposer 125 is disposed between the second semiconductor integrated circuit chips 120 and 120a and electrically connected to the semiconductor integrated circuit chip 120a through at least one bump 160a. The interposer 125 may electrically be connected to the first semiconductor integrated circuit chip 110 by at least one bonding wire 185. Similar to the semiconductor package 1300 illustrated in FIG. 13, except that a through electrode in the second semiconductor integrated circuit chips 120 and 120a may not be formed, the description of the semiconductor package 400 illustrated in FIG. 4 and described in detail above may be applied to the semiconductor package 1400.

Stacking the second semiconductor chips 120 on the active surface 111 of the first semiconductor integrated circuit chip 110 using the interposer 125 may be applied to the semiconductor package 100 illustrated in FIG. 1 and the semiconductor package 200 illustrated in FIG. 2.

Figure 16:
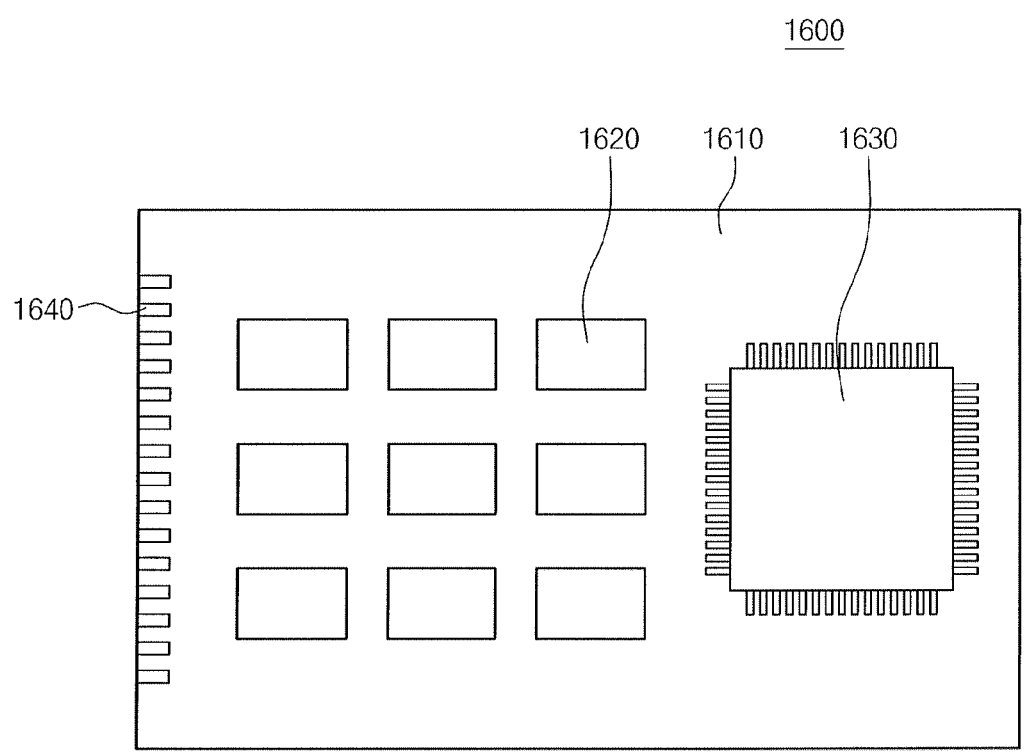
FIGS. 16 to 18 are block diagrams illustrating application examples adopting the semiconductor package according to the exemplary embodiments of the present general inventive concept, respectively.
Figure 17:
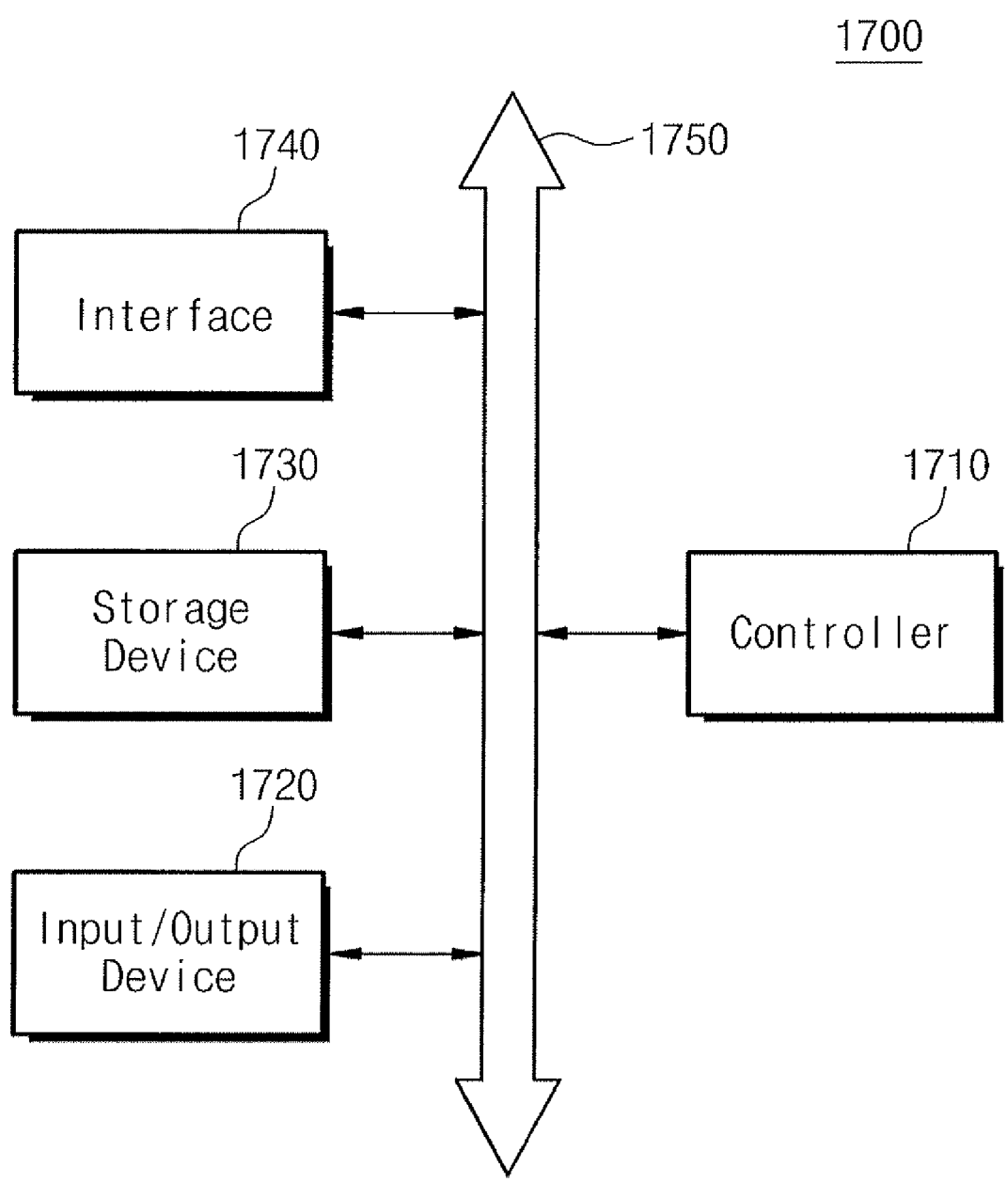
Figure 18:
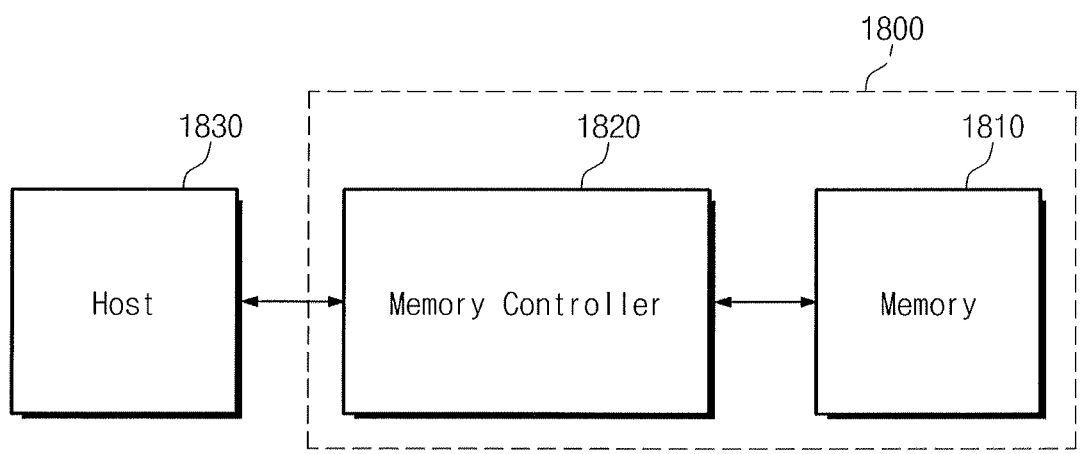

FIGS. 16 to 18 illustrate semiconductor packages according to exemplary embodiments of the present general inventive concept.

Referring to FIG. 16, the above-described semiconductor packages 100 to 1400 may be applied to a package module 1600, including various semiconductor devices. The package module 1600 may include a substrate 1610 having external connection terminals 1640, a semiconductor integrated circuit chip 1620 mounted on the substrate 1610, and a semiconductor integrated circuit chip 1630 packaged in a Quad Flat Package (QFP). The packaging techniques according to exemplary embodiments of the present general inventive concept may be applicable to the semiconductor integrated circuit chips 1620 and 1630. A package module 1600 may be connected to an external electronic device through an external connection terminal 1640.

Referring to FIG. 17, the above-described semiconductor packages 100 to 1400 may be applicable to an electronic system 1700. The electronic system 1700 may include a controller 1710, an input/output device 1720, and a storage device 1730, which are connected through a bus 1750 providing a path along which data are transferred.

The controller 1710 may include, for example, at least one microprocessor, a digital signal processor, a microprocessor, and at least one of logic devices performing similar operations to the above processors. The controller 1710 and the storage device 1730 may include at least one of the semiconductor packages 100 to 1400 according to the embodiments of the present invention. The input/output device 1720 may include at least one selected from the group consisting of a keypad, a keyboard, and a display device. The storage device 1730 may store data and/or instructions executed by the controllers 1710.

The storage device 1730 may include a volatile memory such as a DRAM and/or a non-volatile memory device such as a flash memory. The flash memory may be mounted in, for example, an information processing system such as mobile appliances or desktop computers. The flash memory may include a solid-state disk (SSD). The electronic system 1700 may reliably store massive data in the above-mentioned flash memory system.

The electronic system 1700 may further include an interface 1740 for transmitting/receiving data to/from a communication network. The interface 1740 may be a wired interface or a wireless interface.

The interface 1740 may include, for example, an antenna, a wired or wireless transceiver, etc. The electronic system 1700 may be further provided with an application chipset, a camera image processor (CIS), an input/output device, etc.

The electronic system 1700 may be embodied using a mobile system, a personal computer (PC), a laptop computer, a portable computing device, an industrial computer, a logic system executing various functions, etc. The mobile system may be one of, for example, a personal digital assistant (PDA), a portable computer, a web tablet, a mobile phone, a wireless phone, a laptop computer, a memory card, a digital music system, and an information transmitting/receiving system. If the electronic system 1700 is an apparatus for executing radio and/or cellular communication, it may be used in communication systems such as CDMA (Code Division Multiple Access), GSM (Global System for Mobile communication), NADC (North American Digital Cellular), E-TDMA (Enhanced-Time Division Multiple Access), WCDMA (Wideband Code Division Multiple Access), and CDMA2000.

Referring to FIG. 18, the semiconductor packages 100 to 1400 according to the foregoing exemplary embodiments of the present general inventive concept may be provided as a memory card 1800. The memory card 1800 may include, for example, a memory 1810 such as a non-volatile memory device and a memory controller 1820. The memory 1810 and the memory controller 1820 may store data or read stored data. The memory 1810 may include at least one of non-volatile memory devices having at least one of the semiconductor packages according to the exemplary embodiments of the present general inventive concept. The memory controller 1820 may read stored data in response to receiving a read/write request of a host 1830 or control the memory 1810 to store data.

Although several embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A semiconductor package, comprising:
a first semiconductor device mounted on a package substrate and including an inactive surface having a cavity and an active surface opposite to the inactive surface;
a second semiconductor device disposed on the active surface and electrically connected to the first semiconductor device; and
a third semiconductor device disposed on the inactive surface in the cavity and electrically connected to the first semiconductor device,
wherein the first semiconductor device includes at least one first through electrode to electrically connect the first semiconductor device to the third semiconductor device through the first semiconductor device and at least one second through electrode to electrically connect the first semiconductor device to the package substrate through the first semiconductor device, the at least one first through electrode having a pitch that is less than that of the at least one second through electrode.

2. The semiconductor package of claim 1,
wherein the first semiconductor device is mounted on the package substrate such that the inactive surface faces the package substrate.

3. The semiconductor package of claim 2, wherein the first semiconductor device further includes:
at least one bonding wire whose opposite ends are connected to the active surface and the package substrate, respectively.

4. The semiconductor package of claim 2,
wherein the first semiconductor device includes a substrate including the at least one first through electrode and the at least one second through electrode, and
wherein the substrate includes a first region where the cavity and the at least one first through electrode are formed and a second region where the at least one second through electrode is formed, the first region having a first thickness and the second region having a second thickness greater than the first thickness, and the second region is disposed at a periphery of the first region.

5. The semiconductor package of claim 4, further comprising:
at least one bump disposed between the active surface of the first semiconductor device and the package substrate to electrically connect the first semiconductor device to the package substrate.

6. The semiconductor package of claim 5,
wherein the first semiconductor device includes a substrate including the at least one first through electrode, and
wherein the substrate includes a first region where the cavity and the at least one first through electrode are formed and a second region to which the at least one bump is connected, the first region having a first thickness and the second region having a second thickness greater the first thickness, and the second region being disposed at a periphery of the first region.

7. The semiconductor package of claim 2,
wherein the first semiconductor device includes a substrate including the at least one first through electrode, and
wherein the substrate includes a first region where the cavity and the at least one first through electrode are formed and a second region where at least one bonding wire is formed, the first region having a first thickness and the second region having a second thickness greater than the first thickness, and the second region being disposed to occupy the periphery of the first region.

8. The semiconductor package of claim 1,
wherein the first semiconductor device is mounted on the package substrate such that the active surface faces the package substrate.

9. The semiconductor package of claim 1,
wherein the package substrate includes a first surface and a second surface opposite to the first surface,
wherein a first package is mounted on the first surface, the first package including the first semiconductor device on which the second semiconductor device and the third semiconductor device are disposed, and
wherein a second package is mounted on the second surface, the second package having one or more of the same components as the first package and being mirror-symmetrical to the first package on the package substrate.

10. A semiconductor package, comprising:
a first semiconductor device having a first surface and a second surface, the second surface including a cavity having a first plurality of electrodes disposed on at least one surface of the cavity that electrically connect to the first surface;
a second semiconductor device disposed on the first surface, with a second plurality of electrical connections disposed between the second semiconductor device and the first semiconductor device to electrically connect the first and second semiconductor devices; and
a third semiconductor device disposed in the cavity, with a third plurality of electrical contacts disposed between the third semiconductor device and the first plurality of electrodes to electrically connect the third semiconductor device with the first plurality of electrodes,
wherein the first plurality of electrodes respectively include a plurality of first vias, and the first semiconductor device includes a plurality of second vias, with the plurality of first vias and the plurality of second vias having different pitches.

11. The semiconductor package of claim 10, wherein the first semiconductor device is disposed on a first side of a substrate and is electrically connected to the substrate.

12. The semiconductor package of claim 11, further comprising:
a fourth semiconductor device having a first surface and a second surface, the second surface including a cavity having a first plurality of electrodes disposed on at least one surface of the cavity that electrically connect to the first surface;
a fifth semiconductor device disposed on the first surface, with a second plurality of electrical connections disposed between the fifth semiconductor device and the fourth semiconductor device to electrically connect the fourth and fifth semiconductor devices; and
a sixth semiconductor device disposed in the cavity, with a third plurality of electrical contacts disposed between the sixth semiconductor device and the electrodes to electrically connect the sixth semiconductor device with the electrodes,
wherein the fourth semiconductor device is disposed on a second side of the substrate and is electrically connected to the substrate.

13. A semiconductor package, comprising:
a first semiconductor device mounted on a package substrate and including a first surface having a cavity and a second surface opposite to the first surface;

a second semiconductor device disposed on the first surface in the cavity and electrically connected to the first semiconductor device; and at least one first through electrode disposed in the first semiconductor device to electrically connect the first semiconductor device to the second semiconductor device through the first semiconductor device and at least one second through electrode to electrically connect the first semiconductor device to the package substrate through the first semiconductor device, the at least one first through electrode having a pitch that is less than that of the at least one second through electrode.

* * * * *